(12) United States Patent
Laye

(10) Patent No.: US 8,936,328 B2
(45) Date of Patent: Jan. 20, 2015

(54) SUPPORT STRUCTURE FOR AN ELECTRICAL CONTROL OR PROTECTION APPARATUS FOR A MEDIUM-VOLTAGE ELECTRIC CELL

(71) Applicant: Schneider Electric Industries SAS, Rueil-Malmaison (FR)

(72) Inventor: Jérôme Laye, Grenoble (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 17 days.

(21) Appl. No.: 13/705,461

(22) Filed: Dec. 5, 2012

(65) Prior Publication Data

US 2013/0147328 A1    Jun. 13, 2013

(30) Foreign Application Priority Data

Dec. 12, 2011    (FR) .................................... 11 03799

(51) Int. Cl.
*H05K 5/03* (2006.01)
*H05K 7/20* (2006.01)
*H05K 5/00* (2006.01)
*H05K 5/02* (2006.01)

(52) U.S. Cl.
CPC .. *H05K 7/20* (2013.01); *H05K 5/00* (2013.01); *H05K 5/0247* (2013.01)
USPC ........................................ 312/265.4; 312/236

(58) Field of Classification Search
CPC .......... H02B 13/02; H02B 1/01; G06F 1/181; G06F 1/16; H05K 7/1489; H05K 7/183
USPC ........ 211/26; 312/257.1, 265.1–265.6, 223.1, 312/236, 223.2; 174/50; 403/205, 231, 403; 361/600–626; 218/155–158; 200/293
See application file for complete search history.

(56) References Cited

U.S. PATENT DOCUMENTS

| | | | | |
|---|---|---|---|---|
| 1,356,062 | A | * | 10/1920 | Gorsline ........................ 403/231 |
| 1,473,817 | A | * | 11/1923 | Gorsline .................. 108/157.17 |
| 2,563,441 | A | * | 8/1951 | Wood et al. ................... 361/606 |
| 2,798,785 | A | * | 7/1957 | Chesser ..................... 312/265.1 |
| 6,145,943 | A | * | 11/2000 | Reuter et al. ............... 312/223.1 |

(Continued)

FOREIGN PATENT DOCUMENTS

| | | | |
|---|---|---|---|
| EP | 0 054 265 A2 | | 6/1982 |
| EP | 0030489 | * | 5/1984 |

(Continued)

*Primary Examiner* — Janet M Wilkens
(74) *Attorney, Agent, or Firm* — Steptoe & Johnson LLP

(57) ABSTRACT

A structure for supporting of an apparatus for electrical control or protection of a medium-voltage electrical cell, which structure has two sides substantially parallel to one another, each side having a main portion from which extends a wing, the wings connected at their free ends with two upper crossmembers connected to the main portion of the sides by the wings at their junctions with the main portions, and each having an opening to receive slidingly two of the upper crossmembers, and first abutment and locking means, to prevent movement of the crossmember relative to the structure in five of six degrees of freedom, displacement of the crossmember in translation in a direction opposite to the direction of insertion of the crossmembers being the sixth degree of freedom, installation of the crossmember in the openings without fastening means being sufficient to make the assembly stable.

15 Claims, 15 Drawing Sheets

(56) References Cited

U.S. PATENT DOCUMENTS

| | | | |
|---|---|---|---|
| 7,140,702 B2* | 11/2006 | Byron et al. | 312/296 |
| 7,329,813 B2* | 2/2008 | Josten et al. | 174/68.2 |
| 7,535,701 B2* | 5/2009 | Kobayashi | 361/679.02 |
| 2002/0046979 A1* | 4/2002 | Larsen et al. | 211/26 |
| 2006/0121796 A1* | 6/2006 | Josten et al. | 439/715 |
| 2011/0226710 A1* | 9/2011 | Peng et al. | 211/26 |
| 2011/0316402 A1* | 12/2011 | Hsiao | 312/326 |

FOREIGN PATENT DOCUMENTS

| | | |
|---|---|---|
| EP | 1 587 190 A1 | 10/2005 |
| EP | 2 299 552 A1 | 3/2011 |

* cited by examiner

SUPPORT STRUCTURE FOR AN ELECTRICAL CONTROL OR PROTECTION APPARATUS FOR A MEDIUM-VOLTAGE ELECTRIC CELL

CROSS-REFERENCE TO RELATED APPLICATIONS

This application claims the benefit of priority of French Application No. 11-03799, filed Dec. 12, 2012.

BACKGROUND OF THE INVENTION

The present invention relates to a structure designed for supporting the main portion of an electrical apparatus for electrical control or protection in a medium-voltage electrical cell, the said structure being placed on a bearing surface.

Such structures consisting mainly of uprights, of crossmembers and of cladding metal sheets are known and their installation requires the use of a table and installation template.

Specifically, the current designs of medium-voltage items of equipment is adapted to the current fabrication method, this fabrication being carried out in fitting units dedicated to this installation, in which specialized teams are trained in the product and have the tools and means for carrying out the installation. This means that it is difficult to entrust the installation of such structures to external panel builders.

The present invention solves these problems and proposes a supporting structure for an electrical apparatus for the electrical control or protection of a medium-voltage electrical cell, that is of simple design, comprising a reduced number of parts and being very easy to install because it requires very little toolage for carrying out the installation and has only a reduced number of assembly points.

BRIEF SUMMARY OF THE INVENTION

Accordingly, the subject of the present invention is a structure of the type mentioned above, this structure being characterized in that it comprises two sides that are substantially parallel with one another, each side comprising a portion called the main portion from which extends a portion forming a wing, these two wings being designed to be connected to one another at their free end and at their end connected to the main portion of the sides by respectively two crossmembers called upper crossmembers, the two wings comprising, at their junction with the main portion of the sides, an opening designed to receive slidingly respectively the two ends of one, called the first, of the crossmembers called the upper crossmembers, the said structure comprising means called abutment and locking means, called first abutment and locking means, in order to prevent the relative movement of the said crossmember relative to the structure in five degrees of freedom out of six, the displacement of the crossmember in the sixth degree of freedom corresponding to a translation in a direction opposite to the direction of insertion of the crossmembers being stopped by fastening means, the installation alone of the said crossmember in the said openings without the use of the fastening means being sufficient to make the assembly stable.

According to one particular feature, the upper crossmember called the first crossmember is inserted into the said openings by sliding in a direction substantially perpendicular to the plane of the bearing surface.

According to another feature, this structure comprises a second crossmember called the upper crossmember capable of being installed in the same manner as the first in the two openings provided respectively at the two free ends respectively of the two wings.

According to another feature, each of the aforementioned wings comprises an opening of substantially rectangular shape delimited by two side members, respectively an upper side member and a lower side member, the said side members extending substantially parallel to the bearing surface and the two side members of each side being connected to one another at their free end by a vertical upright made in one piece with the corresponding side, the said structure comprising two other crossmembers called lower crossmembers capable of connecting the two lower side members of the two sides at their end by which they are connected to the corresponding side, and at their free end.

According to another feature, the two lower crossmembers are installed in the said structure in two successive movements, respectively a movement of translation in a direction that is inclined relative to the bearing surface, followed by a movement of rotation relative to an axis extending parallel to the width of the structure, in the direction of the sides, after which the displacement of the crossmembers called the lower crossmembers relative to the structure in the five degrees of freedom is prevented by abutment and locking means called the second abutment and locking means provided on the sides interacting with the crossmembers called the lower crossmembers, the relative displacement of the lower crossmembers relative to the sides in the sixth degree of freedom being stopped by the fastening means.

According to another feature, each of the crossmembers comprises a back wall, a first longitudinal rim bent at a right angle, a second longitudinal rim bent twice at a right angle, a first lateral rim bent at a right angle, a second lateral rim bent at a right angle, the said first longitudinal rim comprising on each side of the crossmember a notch called the first notch extending parallel to the depth of the crossmember, while the lateral rims each comprise, at their free end connected to the longitudinal rim called the second longitudinal rim, a notch called the second notch.

According to another feature, in the installed position of the upper crossmembers, the displacement downwards of the upper crossmembers is stopped by means, on the one hand, of the notches called the second notches each interacting with an edge bent at right angles to the corresponding side, and, on the other hand, at each end of the crossmembers, by means of a portion of the longitudinal rim called the first longitudinal rim of the crossmember interacting respectively with a horizontal face belonging to the corresponding side member.

According to another feature, in the installed position of the upper crossmembers, the lateral displacement of the upper crossmembers is stopped on the one hand by means of the two lateral rims of each crossmember interacting respectively with two vertical faces of the two sides and, on the other hand, by means of the two notches called the first notches of each crossmember interacting respectively with two edges bent at right angles forming a rib belonging respectively to the two upper side members.

According to another feature, in the installed position of the upper crossmembers, the displacement of the upper crossmembers in the longitudinal direction of the structure is stopped first, at each of the ends of each crossmember, by the abutting of a portion of the free edge of the longitudinal rim called the first longitudinal rim with an end portion of a horizontal face belonging to the corresponding side member, secondly, by means of portions of the sides bent straight out interacting with the outer face of the back wall of the crossmembers, and thirdly by means of the notches called the first notches interacting with the edges of the side members forming a rib.

According to another feature, when the lower crossmembers are installed, the two notches called the first notches of each lower crossmember interact respectively with the two edges bent at right angles forming a rib belonging respectively to the two side members called the lower side members so as to guide the said lower crossmembers in rotation in the direction of the sides relative to an axis passing through the points of contact between the end of the said edges and respectively the two notches, until the longitudinal rim called the second longitudinal rim of the lower crossmember comes into contact with the two edges bent straight out belonging respectively to the two sides.

According to another feature, in the installed position of the lower crossmembers, the height-related displacement of the crossmembers is prevented by, on the one hand, the bringing to bear of the longitudinal rim called the first longitudinal rim of each lower crossmember on two horizontal faces belonging respectively to the two lower side members and, on the other hand, by the snap-fitting of the notches called the second notches in the corresponding notches formed at the end of the edges bent at right angles of the sides.

According to another feature, the displacement of the lower crossmembers in the longitudinal direction of the structure is stopped first by bringing the end of two rims bent straight out belonging respectively to the two lower side members into contact with respectively the free longitudinal edge of the two lateral rims of each crossmember, and, secondly, by portions bent at right angles belonging to the two sides being brought into contact with the rear face of the back wall of the crossmembers, and, thirdly, by the notches called the first notches interacting with the portions forming ribs of the lower side members.

According to another feature, the displacement of the lower crossmembers along the width of the structure is stopped on the one hand by placing the two lateral rims of each crossmember in contact with respectively two inner faces belonging respectively to the two side members called the lower side members and on the other hand by the notches called first notches interacting with the portions forming ribs of the lower side members.

According to another feature, the longitudinal rims called the second longitudinal rims are attached to the sides at each of the ends of the crossmembers, by means of rivets.

According to another feature, this structure is designed to house, between the two solid portions of the sides, a cable box, in that the portion situated between the two portions comprising an opening of substantially rectangular shape is designed to allow the discharge of the gases in the event of an inner arc, in that above the latter portion is placed the main portion of the apparatus and in that above this cable box there is a compartment designed to house the portion allowing the control of the apparatus.

BRIEF DESCRIPTION OF THE DRAWINGS

But other advantages and features of the invention will become more apparent in the detailed description that follows and that refers to the appended drawings given only as an example and in which.

DETAILED DESCRIPTION

Figure 1:
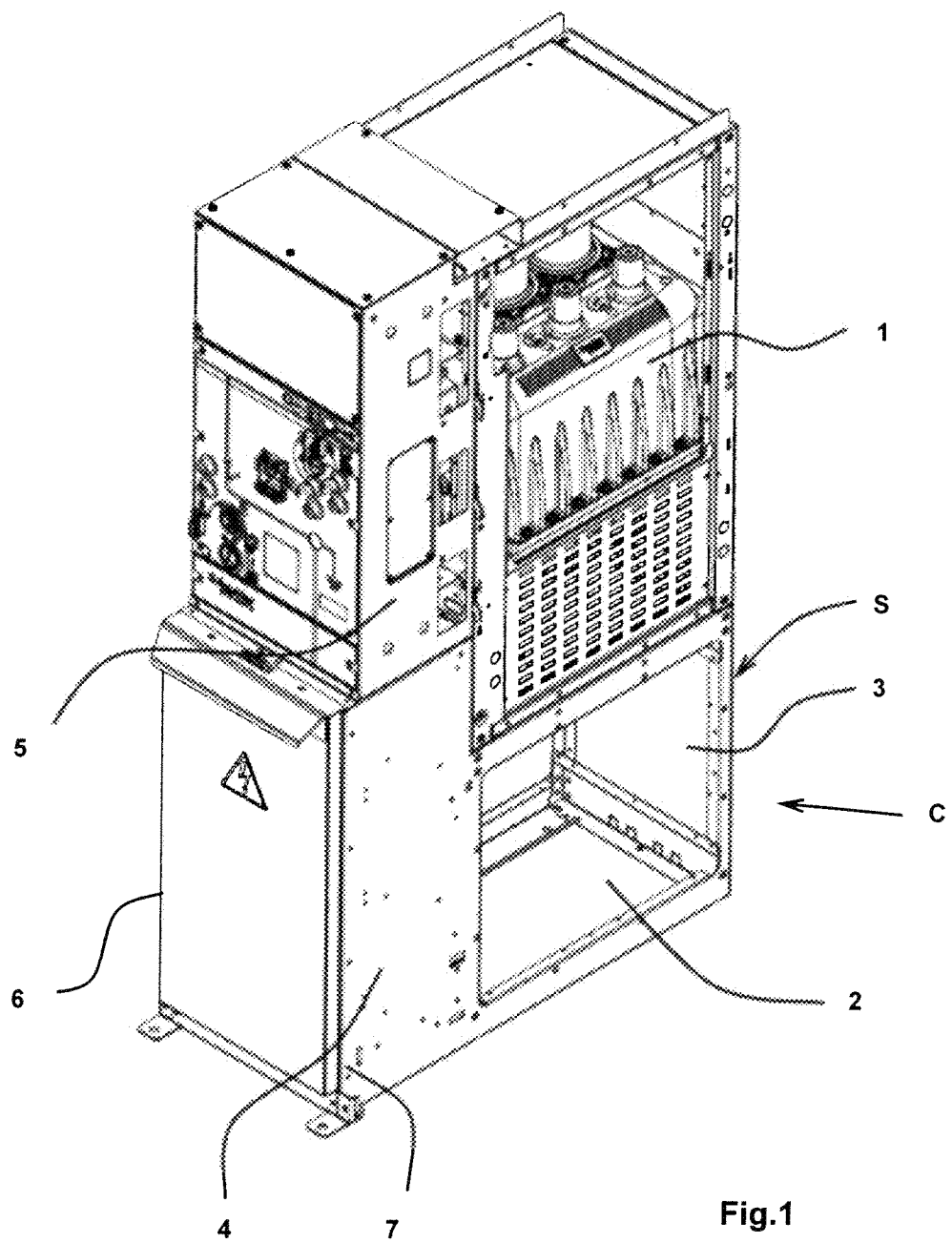
FIG. 1 is a view in perspective illustrating a medium-voltage cell supported by a structure according to a particular embodiment of the invention.
Figure 2:
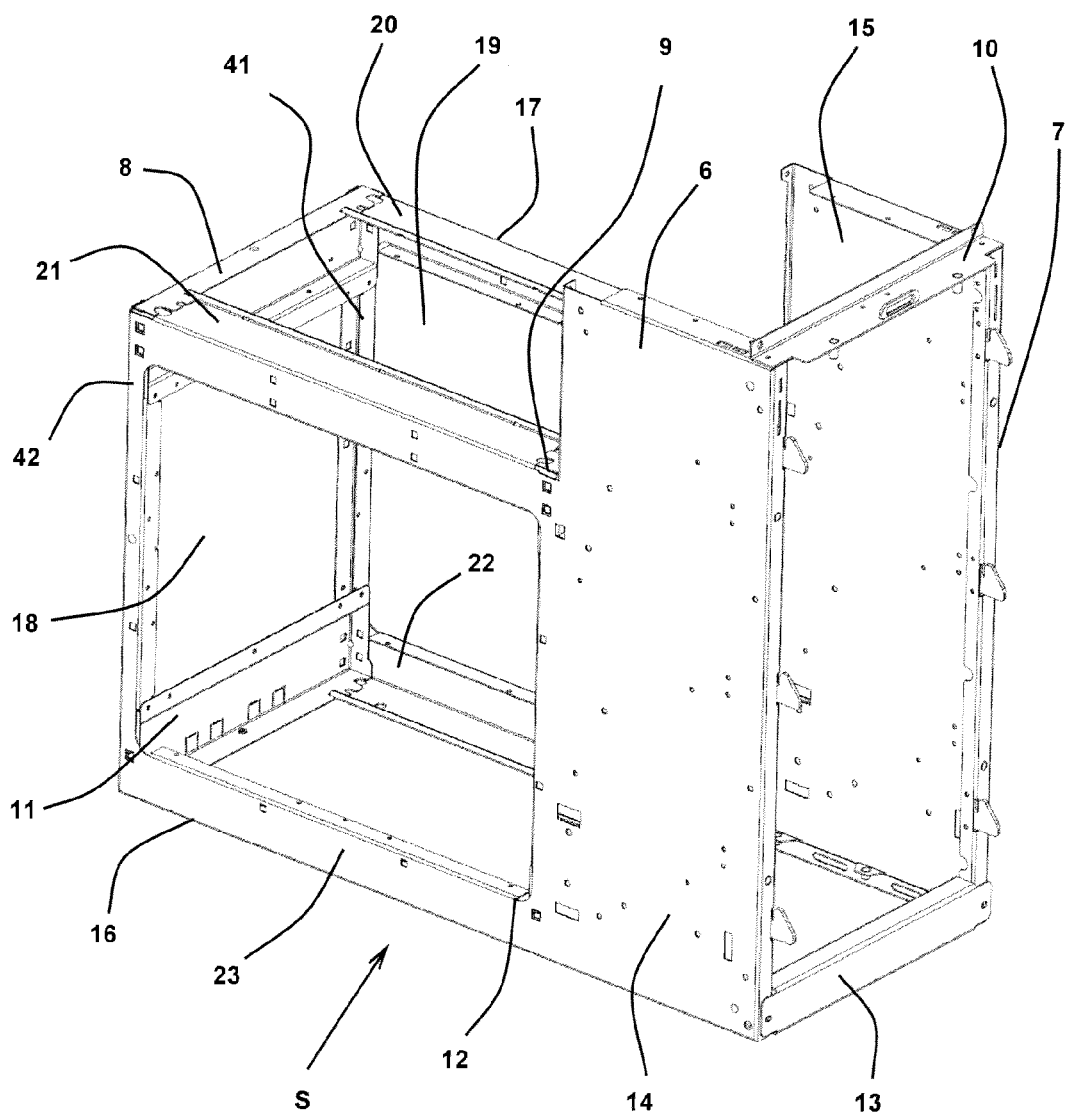
FIG. 2 is a view in perspective illustrating only the structure.

FIG. 1 shows a medium-voltage electrical cell C installed in a structure S according to the invention, the said structure being illustrated separately in FIG. 2, the assembly in the installed position resting on the ground. This structure S comprises a portion raised above the ground forming a bearing surface on which the main portion of the apparatus 1 is placed. The compartment 2 situated beneath this main portion of the apparatus comprises an empty space 3 designed to allow the discharge of the gases in the event of an inner arc. This assembly also comprises, on the side of this empty compartment 2, a closed compartment 4 forming a cable box, above which is placed a portion 5 designed to house the means for controlling the apparatus.

As illustrated in FIG. 2, the structure according to the invention comprises two sides 6, 7 that are parallel with one another, these two sides being connected to one another by crossmembers 8, 9, 10, 11, 12, 13. Each of the two sides comprises a solid portion 14, 15 of substantially rectangular shape from which extend respectively two wings 16, 17 each comprising a rectangular opening 18, 19 each delimited by two horizontal side members 20, 22 and 21, 23 connected by one of their ends to the solid portion of the corresponding side, the two side members of one and the same side being connected to one another at their free end by an upright 41, 42.

These two sides are connected to one another by three crossmembers called upper cross members 8, 9, 10, respectively an upper crossmember 9 called the first crossmember connecting the side members called the upper side members at their connection with the solid portions of the sides, an upper crossmember called the second crossmember 8 connecting the free ends of the side members, and an upper crossmember called the third crossmember 10 connecting the outer corners of the solid portions of the sides.

These two sides are also connected by three crossmembers called lower crossmembers 11, 12, 13 comprising respectively a lower crossmember called the first crossmember 12 connecting the two horizontal side members at their junction with the solid portions of the sides, a lower crossmember called the second crossmember 11 connecting these two side members at their free end, and a lower crossmember called the third crossmember 13 connecting the two lower corners of the sides.

Figure 3:
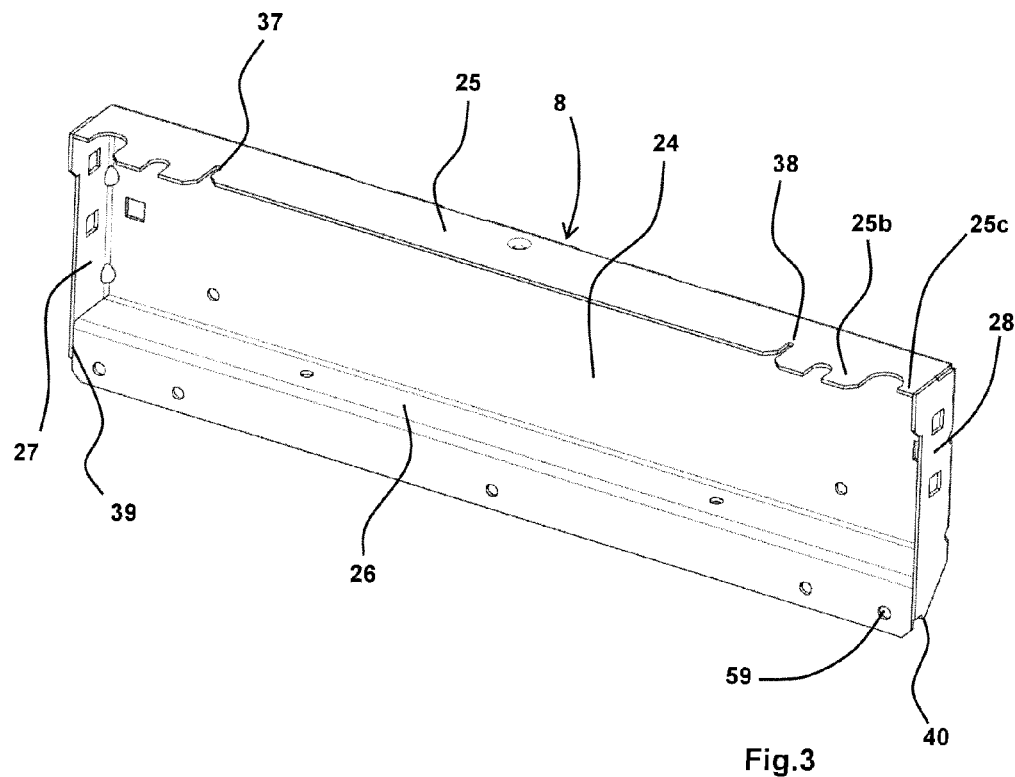
FIG. 3 is a view in perspective illustrating the lower portion of a crossmember according to the invention.
Figure 4:
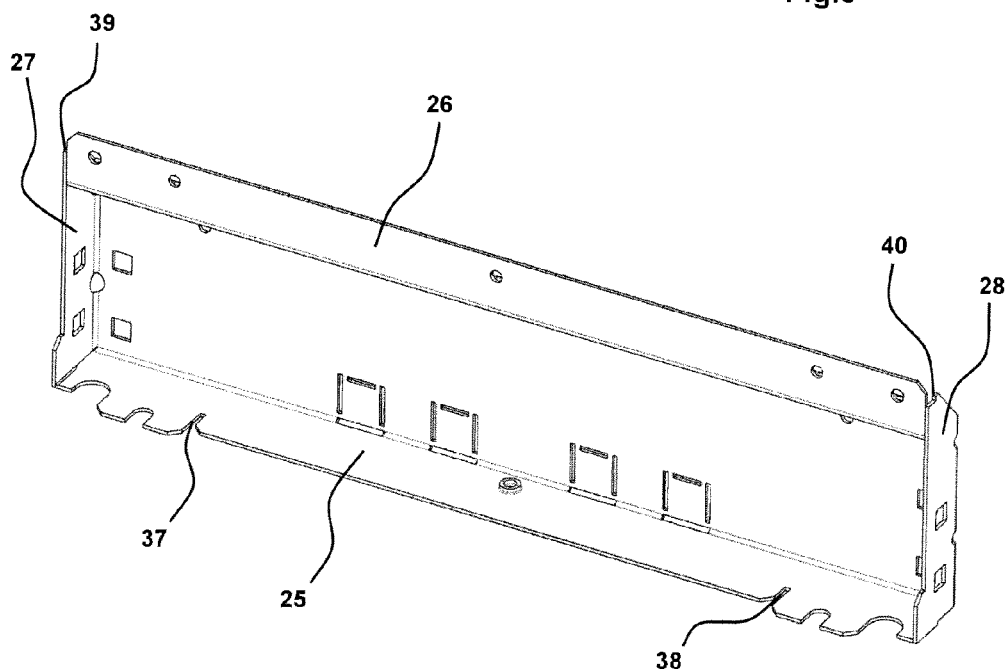
FIG. 4 is a view identical to the previous view, in the reversed position of the crossmember.

FIGS. 3 and 4 illustrate a crossmember 8 that can be used both as an upper crossmember and a lower crossmember, the said crossmember comprising a back wall 24 and four rims, respectively a longitudinal rim called the first rim 25 bent once straight out, a longitudinal rim called the second rim 26 bent twice straight out, a first lateral rim 27 bent straight out and a second lateral rim 28 bent straight out.

Figure 5:
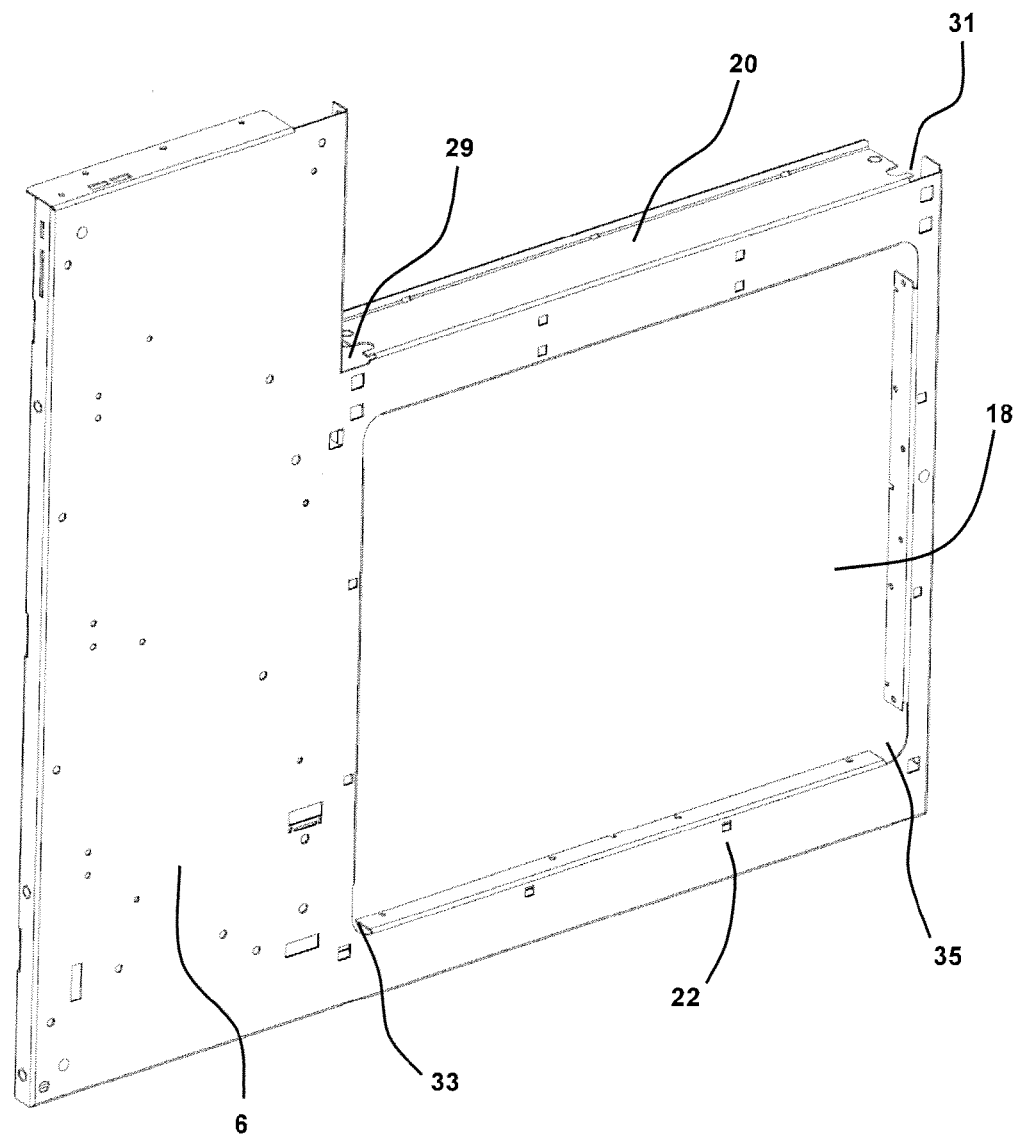
FIG. 5 is a side view of one of the two sides of the structure, illustrating its outer face.
Figure 6:
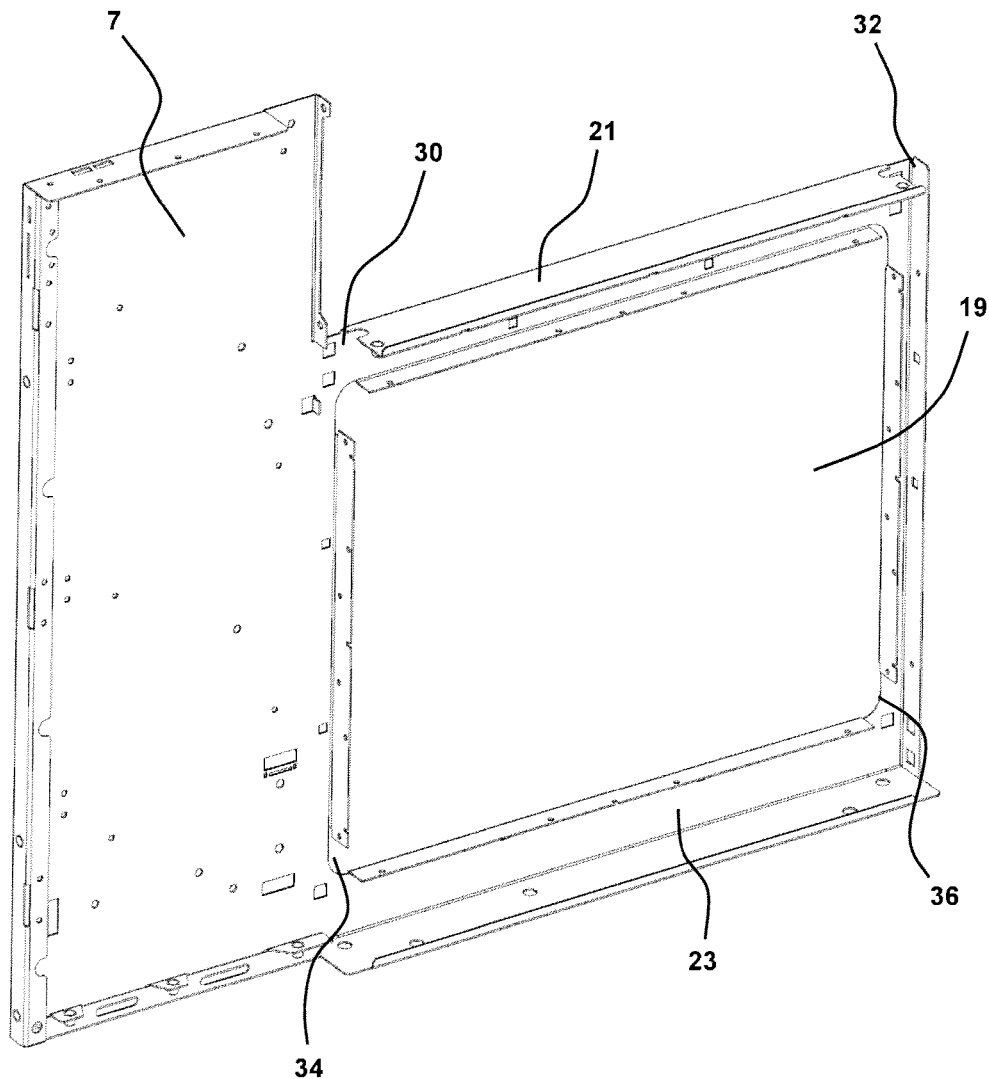
FIG. 6 is a side view of one of the two sides illustrating its inner face.

These crossmembers are designed to be inserted into recesses 29, 30, 31, 32 and 33, 34, 35, 36 (FIG. 5 and FIG. 6) provided for this purpose in the side members and attached relative to these side members by abutment, locking and fastening means provided partly on the crossmembers and partly on the side members.

These abutment and locking means are designed to prevent the relative movement of the crossmembers called upper and lower crossmembers relative to the side members called upper and lower side members in five degrees of freedom of movement, while the relative movement in the last remaining degree of freedom is stopped by riveting or screwing of the crossmembers onto the sides.

Thus, the first longitudinal rim 25 comprises, at each end of each crossmember, a notch called the first notch 37, 38 extending parallel to the depth of the crossmember, while the lateral rims 27, 28 each comprise, at their free end connected to longitudinal rim called the second rim 26, a notch called the second notch 39, 40 extending in the longitudinal direction of the said lateral rims and forming a portion of the aforementioned abutment and locking means.

The installation of the structure as described above will be described below with reference to the figures.

Figure 7:
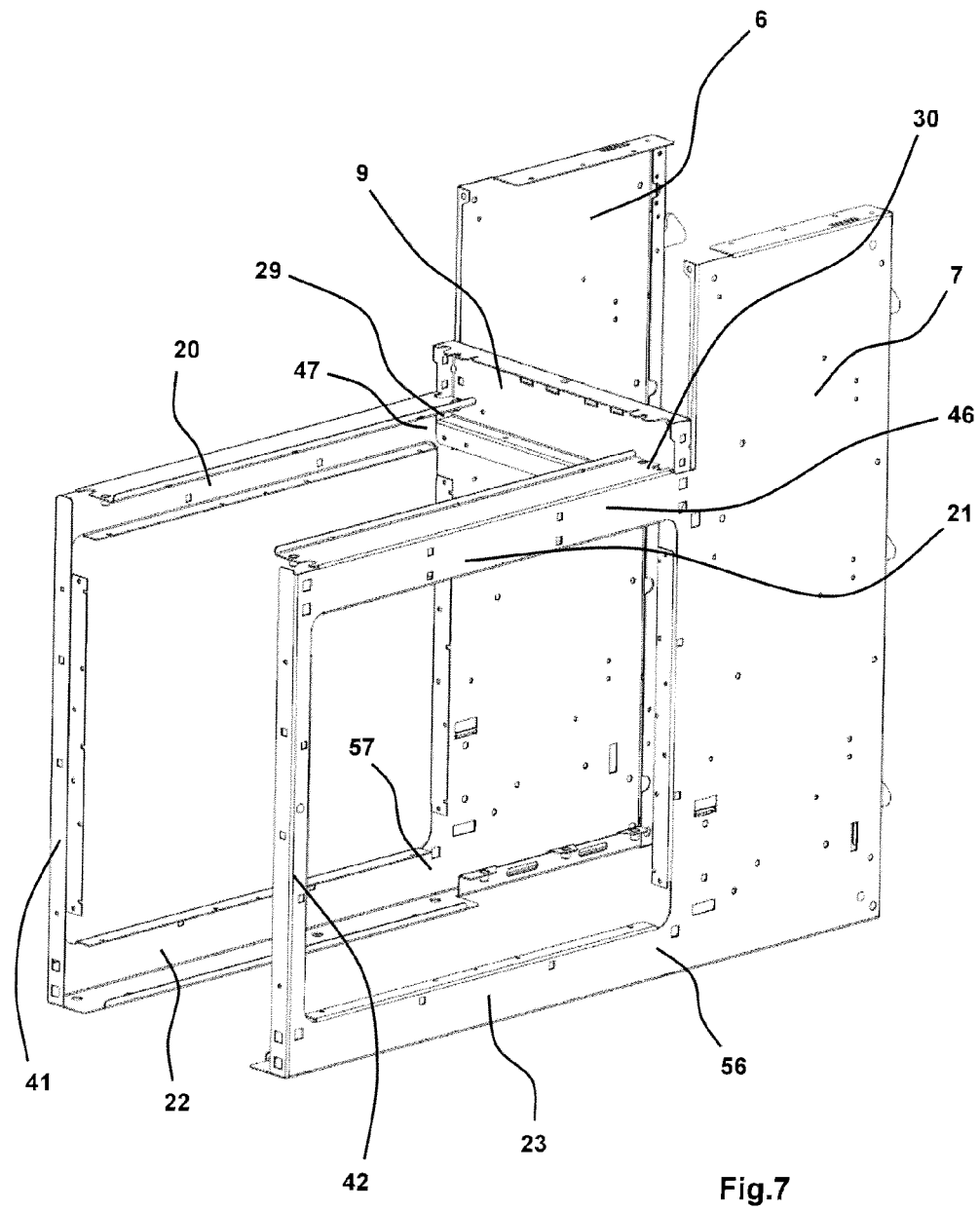
FIGS. 7, 8, 9 and 10 illustrate in perspective four steps of installation allowing the installation of the two upper crossmembers of the structure.

In FIG. 7, an upper, called first, crossmember 9 is inserted into the recesses 29, 30 provided for this purpose in the upper crossmembers 20, 21, this insertion being carried out in a direction substantially perpendicular to the bearing surface of the cell.

Figure 8:
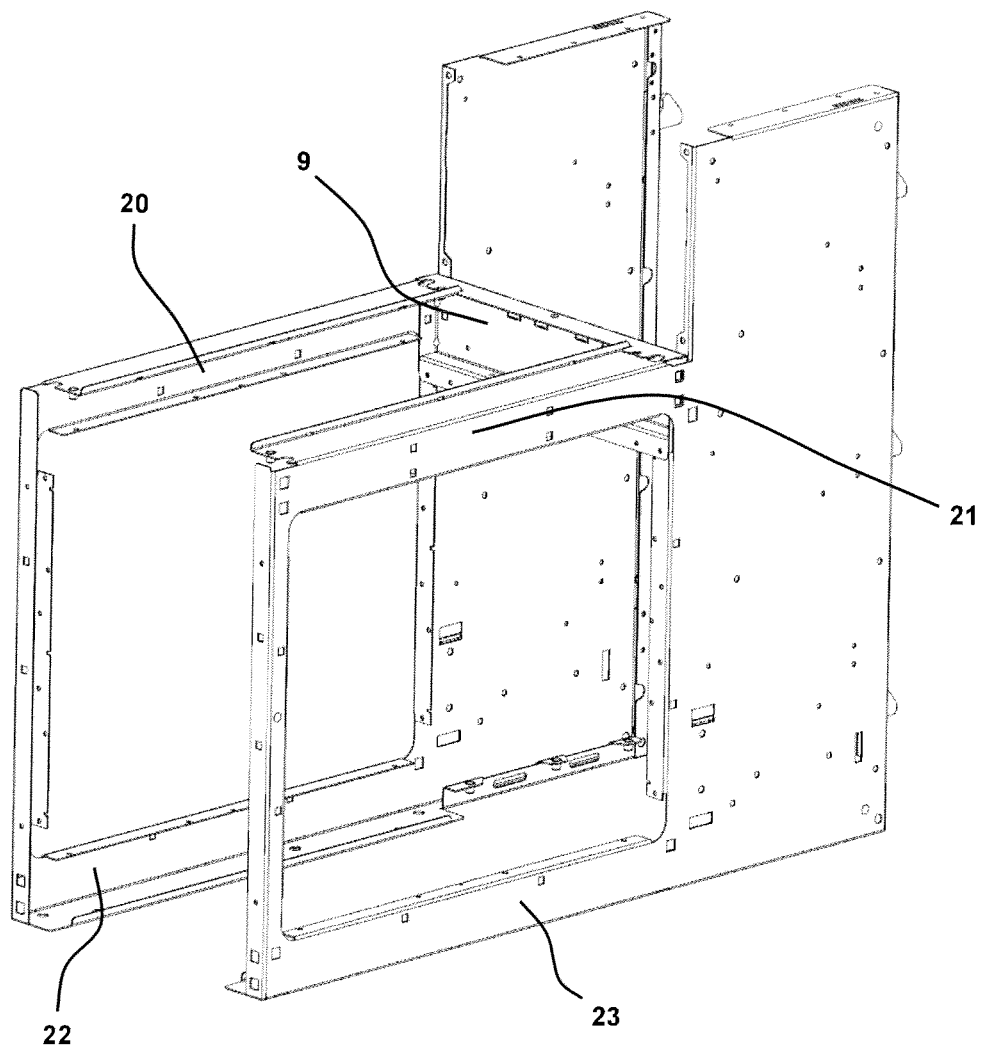
Figure 15:
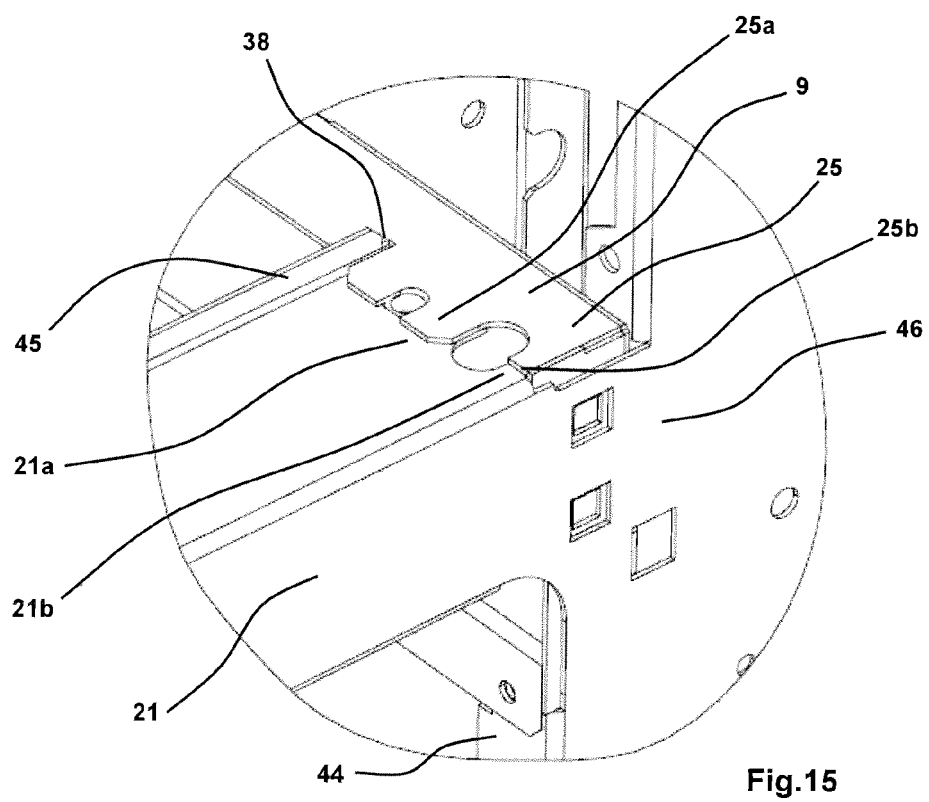
FIG. 15 is a detailed view illustrating in perspective one of the ends of a crossmember called an upper crossmember in a position in which it is installed on the sides.
Figure 16:
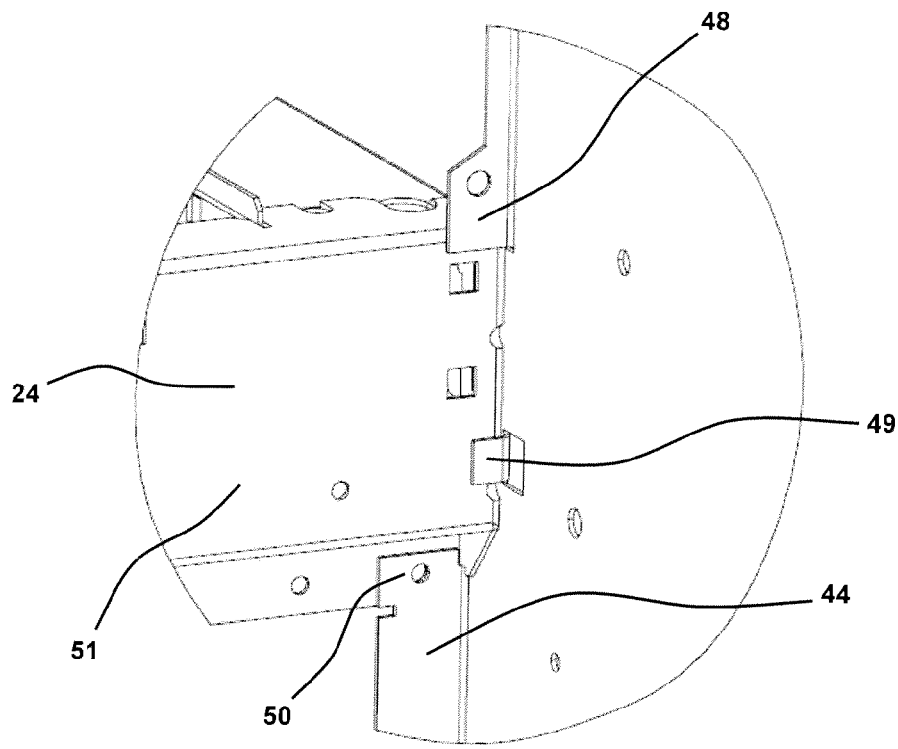
FIG. 16 is a rear view of the above figure.

In FIG. 8, and in particular as illustrated in FIGS. 15 and 16, this crossmember 9 is in a position in which it is installed in the structure. At the end of this insertion, the displacement of the crossmember is stopped, at the two ends of the crossmember, by the interaction between a portion 25a of the first longitudinal rim 25 bent at 90° to the crossmember with a face 21a belonging to the corresponding side member 21 and extending parallel to the bearing surface, and, moreover, the interaction between the notch called the second notch 39, 40 provided at the end of each lateral rim 27 of the crossmember and a notch 43 of matching shape provided at a free end of a rim 44 bent at a right angle to the side.

In this position, the displacement of the crossmember parallel to the transverse direction of the structure, that is to say along its width, is prevented on the one hand, on each side of the crossmember, by the interaction between the notch called the first notch 37, 38 provided in the first longitudinal rim bent straight out 25 of the crossmember interacting with a portion forming a rib 45 of the side member formed by a 90° bend from the latter and, on the other hand, by bringing the lateral rims 27, 28 of the crossmember into contact with an inner face 46, 47 of the corresponding side member.

The displacement of the crossmember in the longitudinal direction of the structure is prevented on the one hand by portions bent at a right angle 48, 49, 50 belonging to the sides interacting with the outer face 51 of the back wall 24 of the crossmember, on the other hand by the aforementioned rib 45 of the side member interacting with the notch called the first notch 37, 38 and finally at each of the ends of each crossmember, by the abutting of a portion 25b of the free edge of the longitudinal rim called the first longitudinal rim 25 with an end portion 21b of a horizontal face 21a belonging to the corresponding side member (21).

Figure 9:
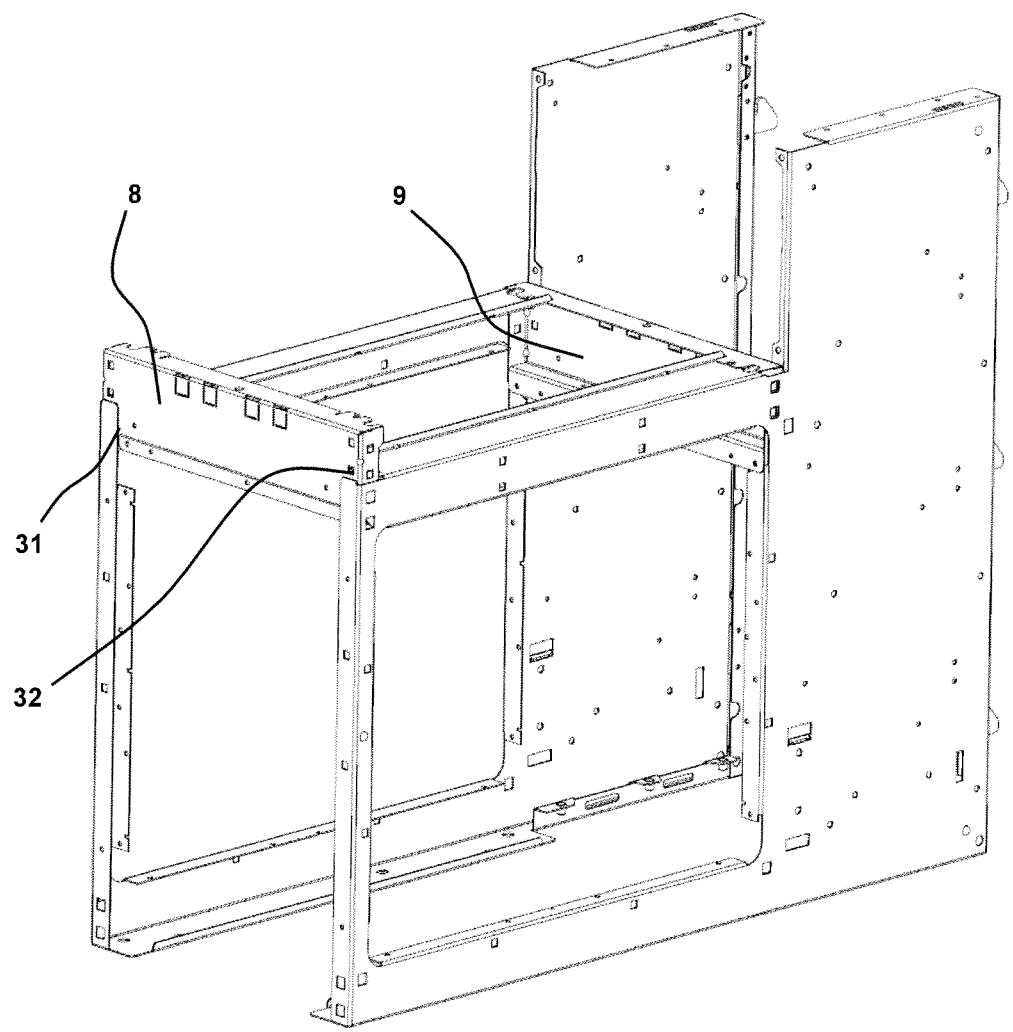
Figure 10:
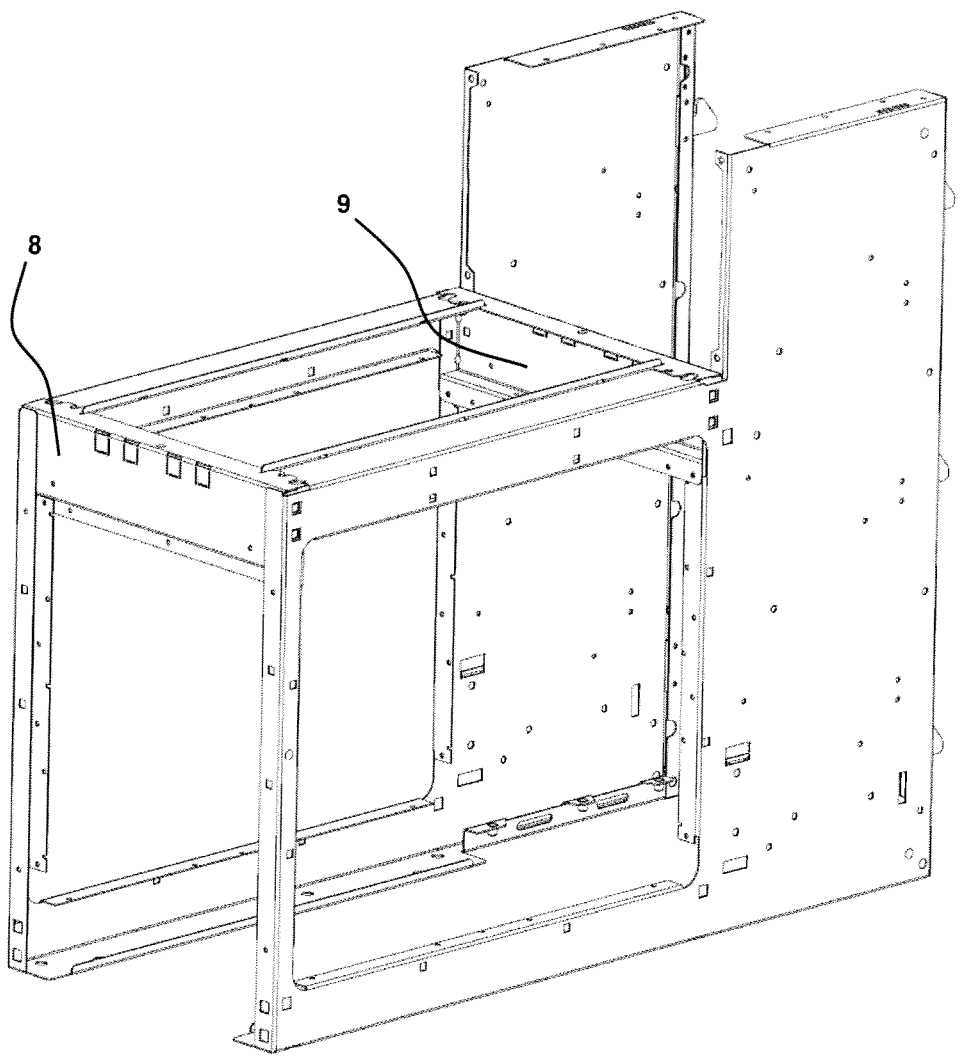

In FIG. 9, a same crossmember 8 is inserted into two recesses 31, 32 provided at the free end of the upper side members in the same manner as for the first side member, this crossmember being in the installed position in FIG. 10.

Figure 11:
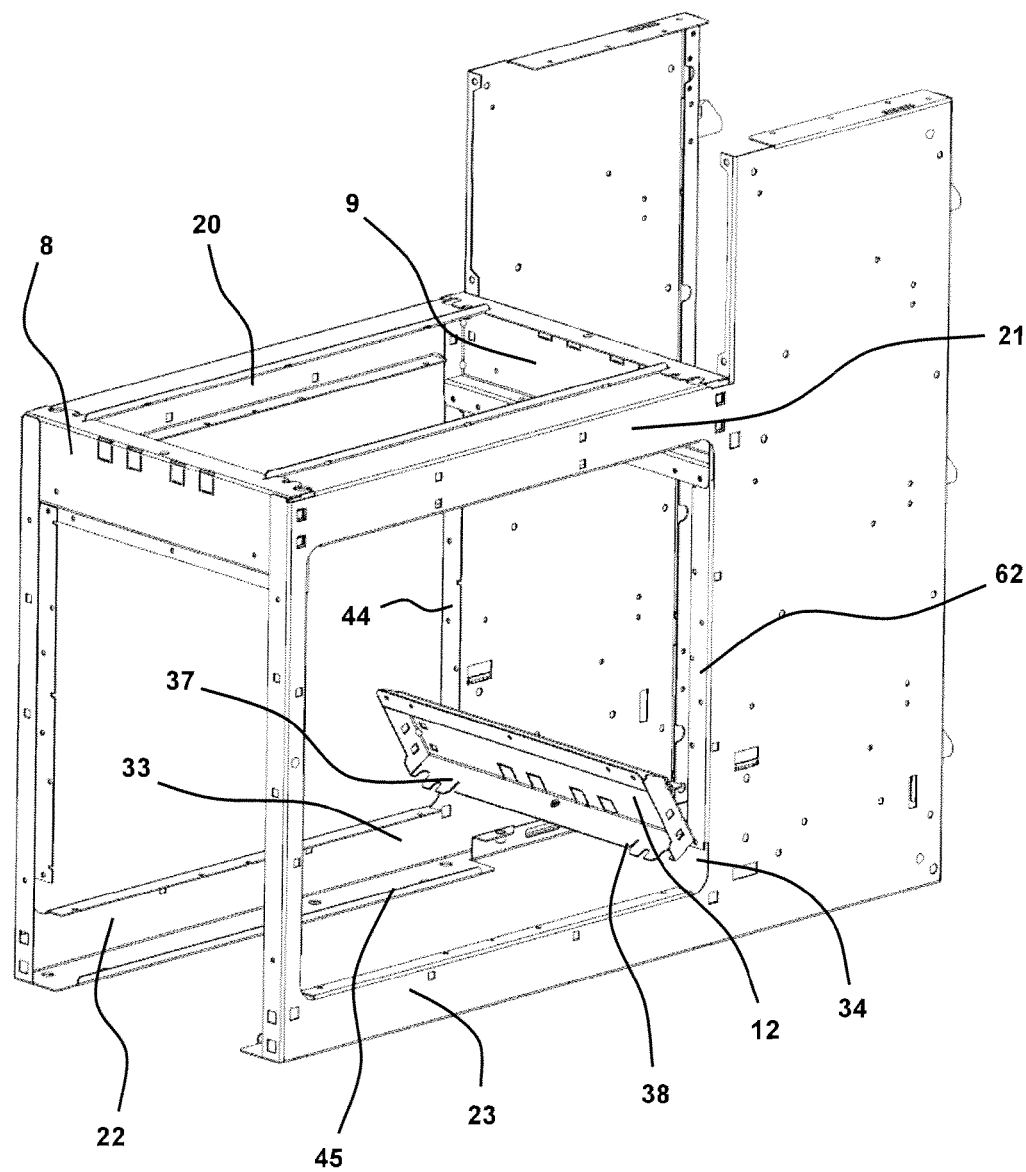
FIGS. 11, 12, 13 and 14 illustrate four steps of installation allowing the installation of two lower crossmembers.
Figure 12:
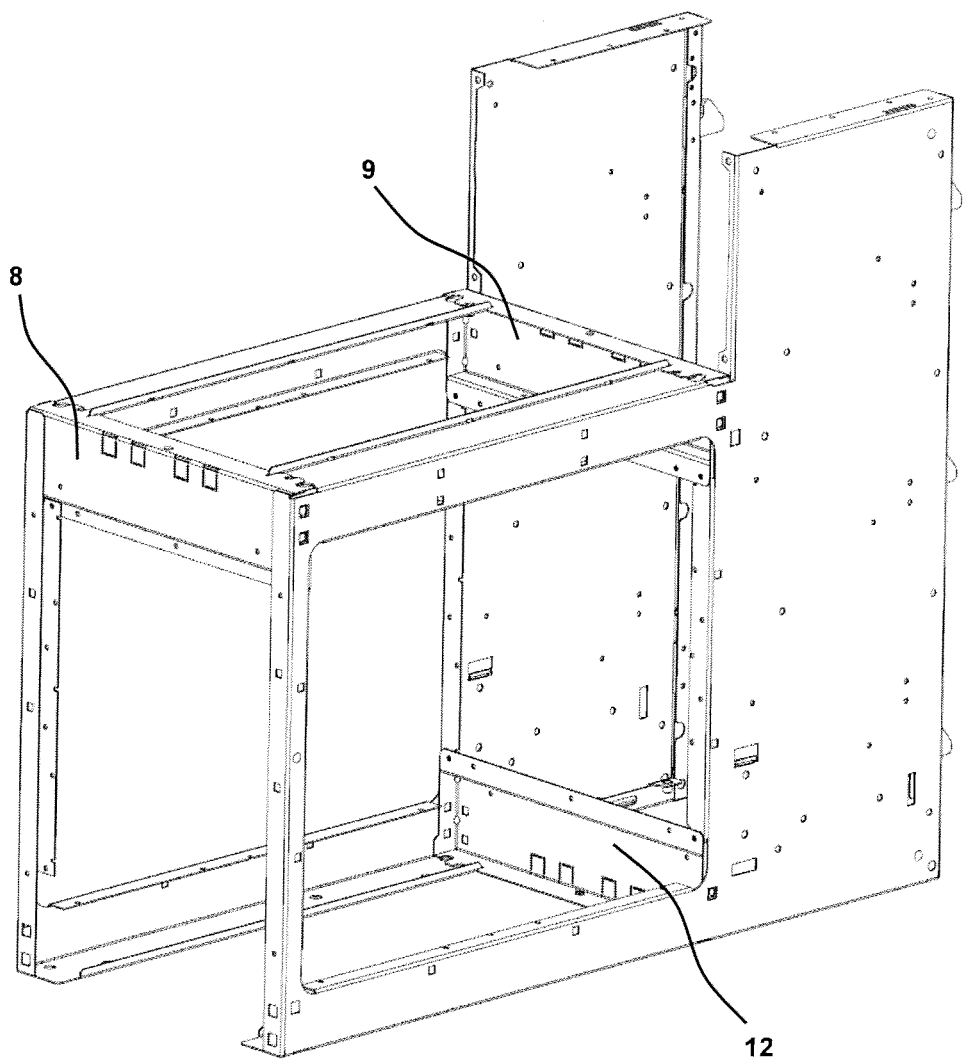
Figure 13:
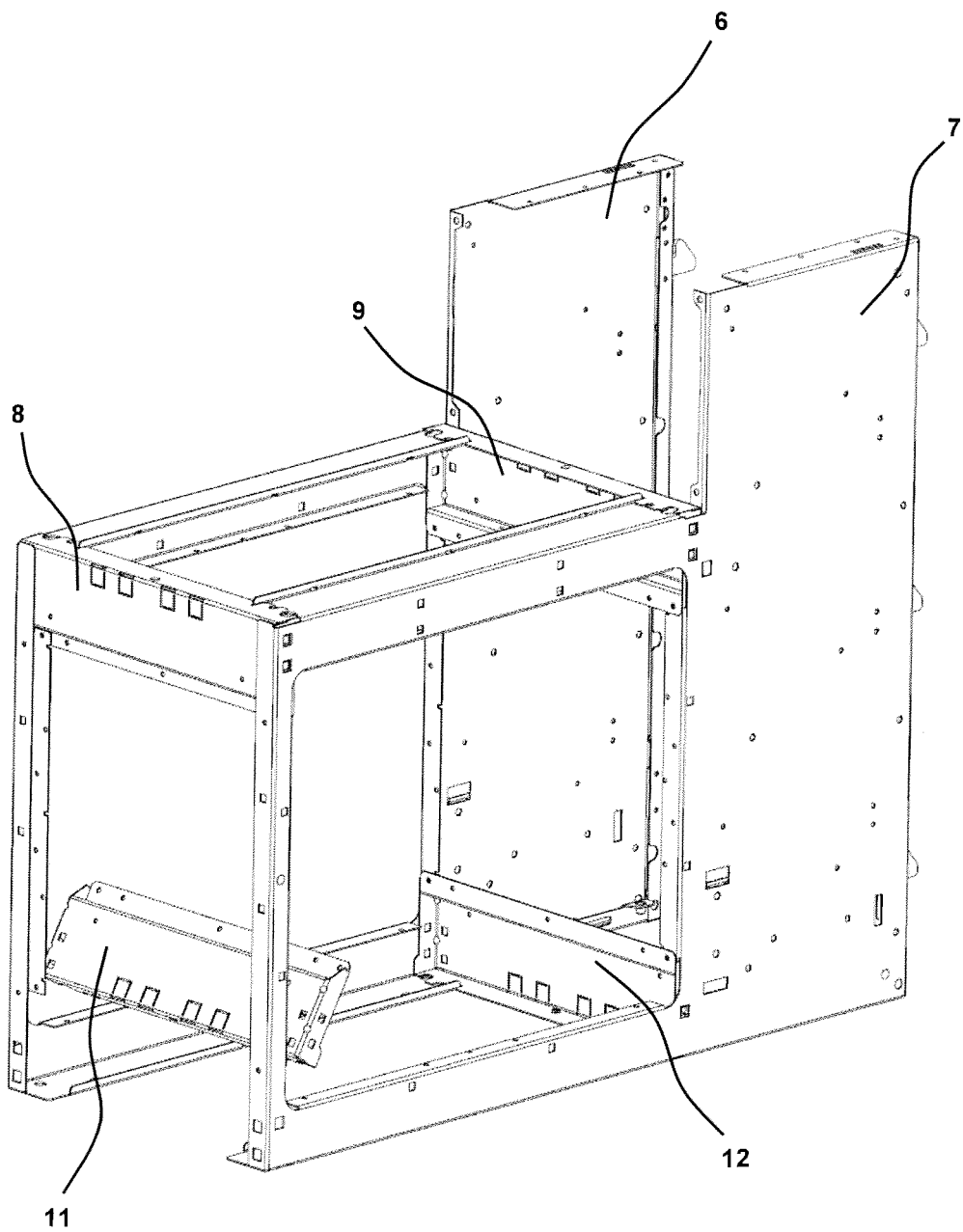
Figure 14:
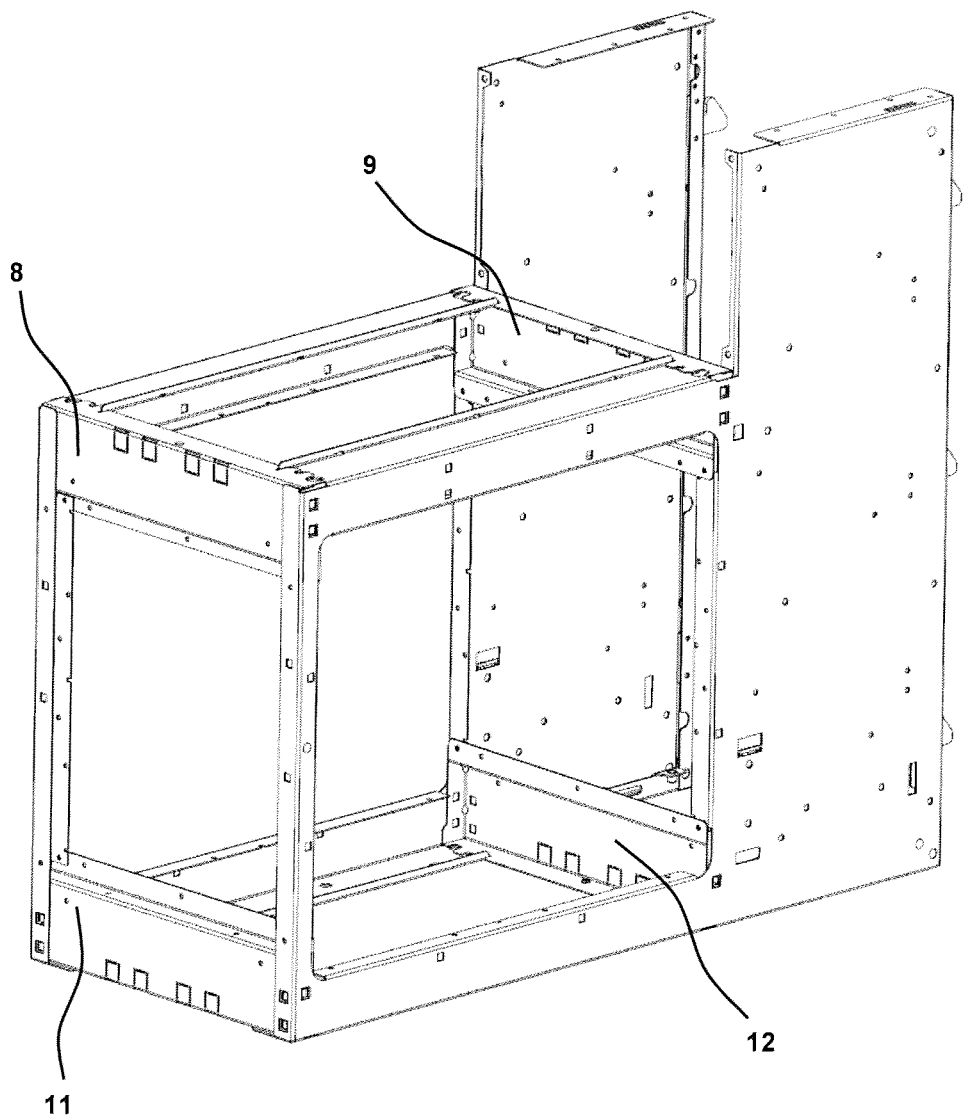

In FIG. 11, the installation of a first crossmember 12 called a lower crossmember is carried out in a recess 33, 34 provided for this purpose in the lower side members 22, 23.

To do this, the crossmember 12 is first of all inserted into the recesses by translation in a direction that is inclined at substantially 45° relative to the bearing surface, then the notches called the first notches 37, 38 provided in the first longitudinal rim 25 are brought to interact with the corresponding ribs 45 formed by edges bent at 90° to the lower side members 22, 23, after which the crossmember 12 is rotated in the direction of the sides by rotation of the crossmember around two rotation points formed by the points of contact between the bottom of the notches called the first notches 37, 38 and the end of the ribs 45. At the end of this rotation, the notches called the second notches 39, 40 formed at the free end of the first and second lateral rims 27, 28 bent straight out interact respectively with the ends 43 of the rims bent straight out 44 of the two sides so as to achieve a locking action by snap-fitting of this crossmember onto these side portions (FIG. 17 and FIG. 18).

Figure 17:
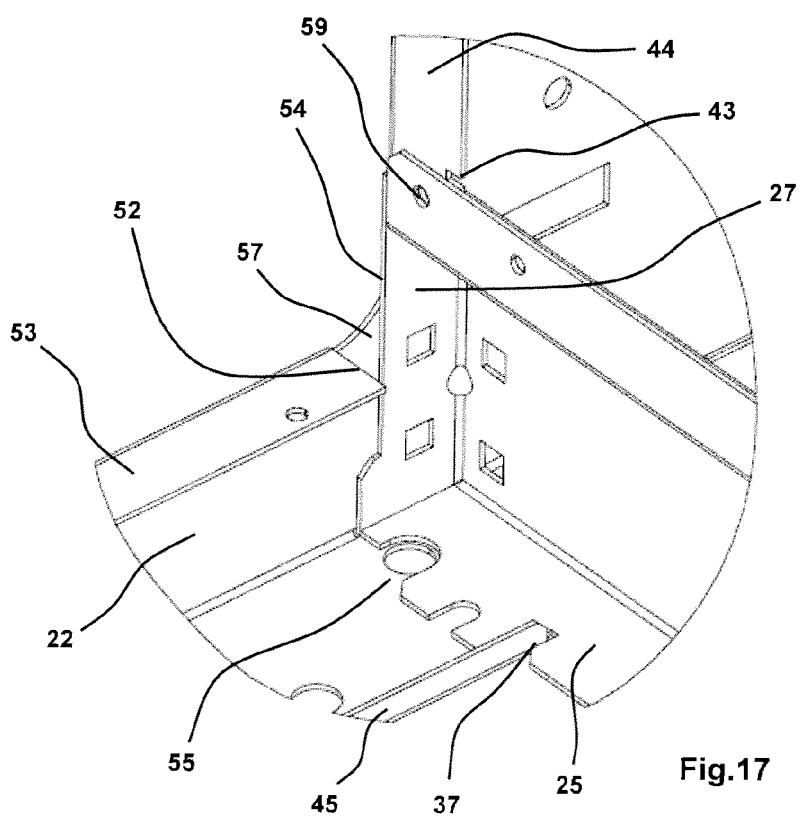
FIG. 17 is a detailed view illustrating in perspective one of the ends of a lower crossmember in a position in which it is installed on the sides.
Figure 18:
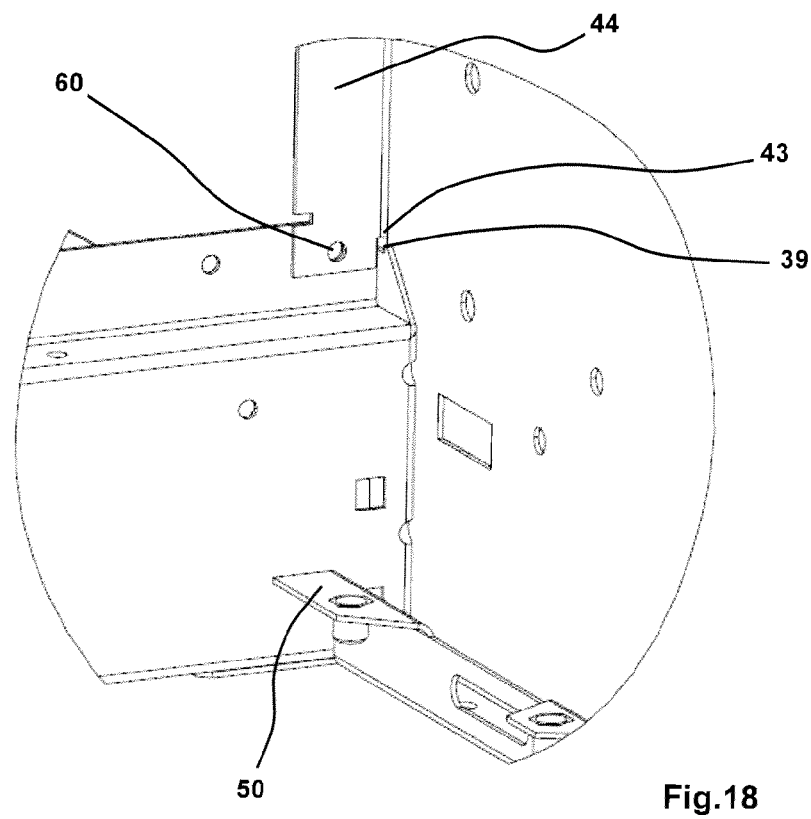
FIG. 18 is a rear view of the above figure.

Thus, in the same manner as during the installation of the upper crossmembers, and as illustrated in FIGS. 17 and 18, the displacement of the lower crossmembers 11, 12 along the length of the structure is prevented by the interaction between, on the one hand, an edge bent straight out forming a rib 45 of the side members 22, 23 and the notches called first notches 37, 38 of the crossmembers, on the other hand, by portions 48, 49, 50 bent at a right angle to the sides resting against the rear face 51 of the back wall 24 of the crossmember, and bringing a free edge 52 of a rim bent at right angles 53 to the side members to rest on the free longitudinal edge 54 of the lateral rims 27, 28.

The displacement of the crossmember in the direction of the height of the structure is prevented on the one hand by resting the first longitudinal rim 25 of the crossmember on a horizontal face 55 of the side member 22 and by snap-fitting the crossmember as described above.

Stopping the movement of the crossmember in the direction of its width is carried out on the one hand by means of the notches called first notches 37, 38 interacting with the ribs 45 and on the other hand by bringing the lateral rims 28, 29 of the crossmembers into contact with the corresponding lateral faces 56, 57 of the lower side members.

The second lower crossmember is installed in the same way as above.

The final fastening is carried out by means of rivets (not shown), eight in total for the four crossmembers, through orifices 59 provided at the ends of the longitudinal rims called the second rims 26 of the crossmembers interacting with orifices 60 provided opposite in the portions bent at a right angle 44, 62 of the solid portions of the sides (FIG. 11, FIG. 17 and FIG. 18).

It will be noted that the final fastening can be carried out by means of other sorts of fastening means including screws and nuts, etc.

A structure has therefore been produced according to the invention that makes it possible, once assembled, to receive the main portion of the cell, this structure being of simple design, because it has a reduced number of parts since only two sides and a single type of crossmember are necessary.

This structure is also very easy to install and is highly ergonomic and has a reduced number of assembly points in order to produce the product.

Specifically, during the installation phase, the operator is helped by the fact that the structure is a stable subassembly when not all the parts are installed. Specifically, this assembly is stable even though there is only one upper crossmember that is installed without the use of fastening points.

The installation of the upper crossmembers is carried out by a single vertical downward movement. The crossmember has only one possible position by virtue of the error-preventing produced by the notches called first notches.

The installation of the lower crossmembers is carried out by a combined movement of translation followed by a rotary movement. The crossmember has only one possible position, by virtue of the error-preventing system consisting of the notches called the first notches interacting with the portions of the side members forming a rib.

Once in position, the stability of the structure is ensured by the control of the positions of the crossmembers. The abutment and locking means make it possible to stop five or six possible degrees of freedom. The final movement is stopped by the fastening points.

Thus, these combined shapes between the sides and the crossmembers allow a good flush fitting which performs the "self-supporting" function when the sides plus one crossmember are assembled and placed on the ground that is subjected to the effects of gravity.

Thus, the degrees of freedom of relative movement are removed, which keeps the assembly in place.

The assembler no longer needs a table or an installation template, and assembly is thereby greatly simplified because it is simpler and faster.

Naturally, the invention is not limited to the embodiment described and illustrated, which has been given only as an example.

On the contrary, the invention comprises all the technical equivalents of the means described and their combinations provided that the latter are carried out in its spirit.

The invention claimed is:

1. A structure for supporting a main portion of an electrical apparatus for electrical control or protection in a medium-voltage electrical cell, when said structure is supported on a bearing surface, said structure comprising:

two sides that are substantially parallel with one another, each side comprising a main portion from which extends a portion forming a wing, said wings being connected to one another at their free ends and at their ends connected to the main portion of the sides by, respectively, two upper crossmembers, the wings forming, at their junctions with the main portions of the sides, an opening for slidingly receiving, respectively, the two ends of a first said upper crossmember, the structure comprising first abutment and locking means that are carried partly by the first upper crossmember and partly by the sides, for preventing relative movement of said first upper crossmember relative to the structure in five of six degrees of freedom, the sixth degree of freedom corresponding to a direction opposite to the direction of insertion of the first upper crossmember, said first abutment and locking means being stopped by fastening means carried partly by the first upper crossmember and partly by the sides, so that installation of the said first upper crossmember alone in said opening prior to use of fastening means is sufficient to make the structure stable under the effect of gravity.

2. A structure according to claim 1, wherein the first upper crossmember is insertable into said opening by sliding in a direction substantially perpendicular to the plane of a bearing surface.

3. A structure according to claim 1, wherein a second said upper crossmember is insertable into openings in the wings by sliding in a direction substantially perpendicular to the plane of a bearing surface.

4. A structure according to any one of claim 1, 2 or 3, wherein each of the aforementioned wings includes an opening of substantially rectangular shape delimited by two side members, an upper side member, and a lower side member, said side members extending substantially parallel to the plane of a bearing surface, and the two side members of each side connected to one another at their free ends by a vertical upright integral with the side, said structure comprising two other lower crossmembers for connection to the two lower side members of the two sides at their ends by which they are connected to the side, and at their free ends.

5. A structure according to claim 4, wherein the two lower crossmembers are installable in said structure in two successive movements, respectively, namely, a movement of translation in a direction inclined relative to a bearing surface, followed by a movement of rotation relative to an axis extending parallel to the width of the structure, in the direction of the sides, after which displacement of the lower crossmembers relative to the structure in the five degrees of freedom is prevented by second abutment and locking means on the sides and interacting with the lower crossmembers, displacement of the lower crossmembers relative to the sides in the sixth degree of freedom being stopped by second fastening means.

6. A structure according to claim 4, wherein each of the crossmembers comprises a back wall, having a first longitudinal rim bent at a right angle, a second longitudinal rim bent twice at a right angle, a first lateral rim bent at a right angle, a second lateral rim bent at a right angle, the said first longitudinal rim comprising on each side of the crossmember a first notch extending parallel to the depth of the crossmember, while the lateral rims each comprise, at their free ends connected to the second longitudinal rim, a second notch.

7. A structure according to claim 6, wherein, in the installed position of the upper crossmembers displacement downwards of the upper crossmembers is stopped, on the one hand, by the second notches each interacting with an edge bent at right angles of the corresponding side, and, on the other hand, at each end of the crossmembers, by a portion of the first longitudinal rim of the crossmember interacting, respectively, with a horizontal face of the corresponding side member.

8. A structure according to claim 6, wherein, in installed position of the upper crossmembers, lateral displacement of the upper crossmembers is stopped, on the one hand, by the two lateral rims of each crossmember interacting, respectively, with two vertical faces of the two sides and, on the other hand, by the two first notches of each crossmember interacting, respectively, with two edges bent at right angles forming a rib, respectively, of the two upper side members.

9. A structure according to claim 6, wherein, in the installed position of the upper crossmembers, displacement of the upper crossmembers in the longitudinal direction of the structure is stopped first, at each of the ends of each crossmember, by an abutting portion of the free edge of the first longitudinal rim with an end portion of a horizontal face of the corresponding side member, secondly, by portions bent straight of the sides interacting with the outer face of the back wall of the crossmembers, and thirdly by the first notches interacting with the edges of the side members forming a rib.

10. A structure according to claim 6, wherein, when the lower crossmembers are installed, the two first notches of each lower crossmember interact, respectively, with the two edges bent at right angles forming a rib, respectively, of the two side lower side members to guide the lower crossmembers in rotation in the direction of the sides relative to an axis passing through the points of contact between the end of the said edges and, respectively, the two notches, until the second longitudinal rim of the lower crossmember comes into contact with the two edges bent straight, respectively, of the two sides.

11. A structure according to claim 10, wherein, in the installed position of the lower crossmembers, height related displacement of the crossmembers is prevented, on the one hand, by bringing to bear the first longitudinal rim of each lower crossmember on two horizontal faces, respectively, of the two lower side members, and, on the other hand, by snap-fitting the second notches in the corresponding notches formed at the ends of the edges bent at right angles of the sides.

12. A structure according to claim 10, wherein displacement of the lower crossmembers in the longitudinal direction of the structure is stopped, first by bringing the end of two rims bent straight out, respectively, to the two lower side members into contact with, respectively, the free longitudinal edge of the two lateral rims of each crossmember, and, secondly, by portions bent at right angles of the two sides in contact with the rear face of the back wall of the crossmembers, and, thirdly, by the first notches interacting with the portions forming ribs of the lower side members.

13. A structure according to claim 10, wherein displacement of the lower crossmembers along the width of the structure is stopped, on the one hand, by placing the two lateral rims of each crossmember in contact with, respectively, two inner faces, respectively, of the lower side members, and, on the other hand, by the first notches interacting with the portions forming ribs of the lower side members.

14. A structure according to any one of claim 6, wherein the second longitudinal rims are attached to the sides at each of the ends of the crossmembers by rivets.

15. A structure according to any one of claim 6, each of the ends of the crossmembers by of rivets. wherein said structure is designed to house, between the two sides, a cable box, so that the opening of substantially rectangular shape will permit discharge of gases in the event of an inner arc, and above said opening there is a compartment for housing an electronic control apparatus.

* * * * *